US012653055B2

(12) United States Patent
Kogure et al.

(10) Patent No.: US 12,653,055 B2
(45) Date of Patent: Jun. 9, 2026

(54) POWER CONTROL APPARATUS

(71) Applicant: DENSO CORPORATION, Kariya-city (JP)

(72) Inventors: Shintaro Kogure, Kariya-city (JP); Satoshi Yamaura, Kariya-city (JP)

(73) Assignee: DENSO CORPORATION, Kariya (JP)

( * ) Notice: Subject to any disclaimer, the term of this patent is extended or adjusted under 35 U.S.C. 154(b) by 395 days.

(21) Appl. No.: 18/516,110

(22) Filed: Nov. 21, 2023

(65) Prior Publication Data

US 2024/0088013 A1 Mar. 14, 2024

Related U.S. Application Data

(63) Continuation of application No. PCT/JP2022/021625, filed on May 26, 2022.

(30) Foreign Application Priority Data

Jun. 24, 2021 (JP) ................................. 2021-105096

(51) Int. Cl.
H10W 72/00 (2026.01)
B60R 16/023 (2006.01)
(Continued)

(52) U.S. Cl.
CPC ......... H10W 72/00 (2026.01); B60R 16/0238 (2013.01); H02K 3/50 (2013.01);
(Continued)

(58) Field of Classification Search
CPC ..... H10W 72/00; H10W 40/47; H10W 90/00; B60R 16/0238; H02K 3/50; H02K 9/19;
(Continued)

(56) References Cited

U.S. PATENT DOCUMENTS 10,026,673 B2 * 7/2018 Okumura .............. H01L 23/051
10,842,055 B2 * 11/2020 Hirose ................. H01L 23/473
(Continued)

FOREIGN PATENT DOCUMENTS

JP 2015-012743 A 1/2015
JP 2018-042424 A 3/2018
(Continued)

OTHER PUBLICATIONS

JP 2021182820A—Power Conversion Device, 26 pages. (Year: 2026).*
Jul. 12, 2022 International Search Report issued in International Patent Application No. PCT/JP2022/021625.

*Primary Examiner* — Tuyen K Vo

(74) *Attorney, Agent, or Firm* — Oliff PLC

(57) ABSTRACT

A power control apparatus includes a busbar unit which supports a plurality of busbars connected to a plurality of semiconductor modules. The busbar includes a first plate shaped portion and a second plate shaped portion. The first plate shaped portion is adjacent to a cooling device in a posture facing an internal passage of the cooling device in the plate thickness direction. The second plate shaped portion is placed in a posture in which a plate thickness direction thereof intersects with a plate thickness direction of the first plate shaped portion. The second plate shaped portion has outer surfaces including a side surface having a narrower width corresponding to a plate thickness. The second plate shaped portion is placed in a posture in which the side surface faces the semiconductor module.

8 Claims, 4 Drawing Sheets

(51) Int. Cl.

| | |
|---|---|
| *H02K 3/50* | (2006.01) |
| *H02K 9/19* | (2006.01) |
| *H02K 11/27* | (2016.01) |
| *H02K 11/33* | (2016.01) |
| *H10W 40/47* | (2026.01) |
| *H10W 90/00* | (2026.01) |

(52) U.S. Cl.
CPC ............... *H02K 9/19* (2013.01); *H02K 11/27* (2016.01); *H02K 11/33* (2016.01); *H10W 40/47* (2026.01); *H10W 90/00* (2026.01); *H02K 2203/09* (2013.01)

(58) Field of Classification Search
CPC .... H02K 11/27; H02K 11/33; H02K 2203/09; H01L 23/4012; H01L 23/473; H01L 25/115; H02M 7/48
See application file for complete search history.

(56) References Cited

U.S. PATENT DOCUMENTS

| 11,588,413 B2 * | 2/2023 | Kitahama | ............. H01L 23/473 |
|---|---|---|---|
| 2013/0241082 A1 | 9/2013 | Okamura | |
| 2020/0118986 A1 * | 4/2020 | Hori | ...................... H01L 25/115 |
| 2020/0203255 A1 * | 6/2020 | Tschida | ................. H01L 23/427 |

FOREIGN PATENT DOCUMENTS

| JP | 2019-221048 A | 12/2019 |
|---|---|---|
| JP | 2021-069188 A | 4/2021 |

* cited by examiner

POWER CONTROL APPARATUS

CROSS REFERENCE TO RELATED APPLICATIONS

The present application is a continuation application of International Patent Application No. PCT/JP2022/021625 filed on May 26, 2022, which designated the U.S. and is based on and claims the benefit of priority from Japanese Patent Application No. 2021-105096 filed on Jun. 24, 2021, and all the contents of the application are incorporated by reference.

TECHNICAL FIELD

The present disclosure relates to a power control apparatus.

BACKGROUND

A power control apparatus is required to manage heat generated by electric current and the like. The power control apparatus uses busbars to conduct electric current. The busbars are not only electric conductor but also thermal conductor. In the above aspects, or in other aspects not mentioned, there is a need for further improvements in a r power control apparatus.

SUMMARY

One of a power control apparatus comprises: a semiconductor module embedding a semiconductor element; a cooling device which cools the semiconductor module by enabling a cooling fluid to flow through an internal passage; and a busbar unit which supports s busbar connected to the semiconductor module and includes an electrical component. The busbar includes a first plate shaped portion and a second plate shaped portion which is placed in a posture in which a plate thickness direction thereof intersects with a plate thickness direction of the first plate shaped portion. The first plate shaped portion is placed to be adjacent to the cooling device in a posture facing the inner passage of the cooling device in the plate thickness direction. The second plate shaped portion has outer surfaces including a side surface having a narrower width corresponding to the plate thickness. The second plate shaped portion is placed in a posture in which the side surface faces the semiconductor module.

According to this power control apparatus, since the first plate shaped portion of the busbar faces the internal passage in the plate thickness direction, the wider width surface of the first plate shaped portion can be placed adjacent to the cooling device. Thereby, the wider width surface of the first plate shaped portion can be cooled by the cooling device, so that the busbar can efficiently absorb heat. Furthermore, since the second plate shaped portion is located to place the side surface extending in the plate thickness direction among the outer surface faces the semiconductor module, the side surface with the narrower width corresponding to the plate thickness of the busbar faces the semiconductor module. Thereby, the heat from the semiconductor module is received by the side surface with the narrower width of the second plate shaped portion, so that the amount of heat received by the busbar can be suppressed. According to the technology disclosed, it is possible to provide a power control apparatus capable of suppressing an amount of heat received from the semiconductor element and ensuring the heat dissipation performance of the busbar.

BRIEF DESCRIPTION OF DRAWINGS

The disclosure is further described with reference to the accompanying drawings in which.

DETAILED DESCRIPTION

Figure 1:
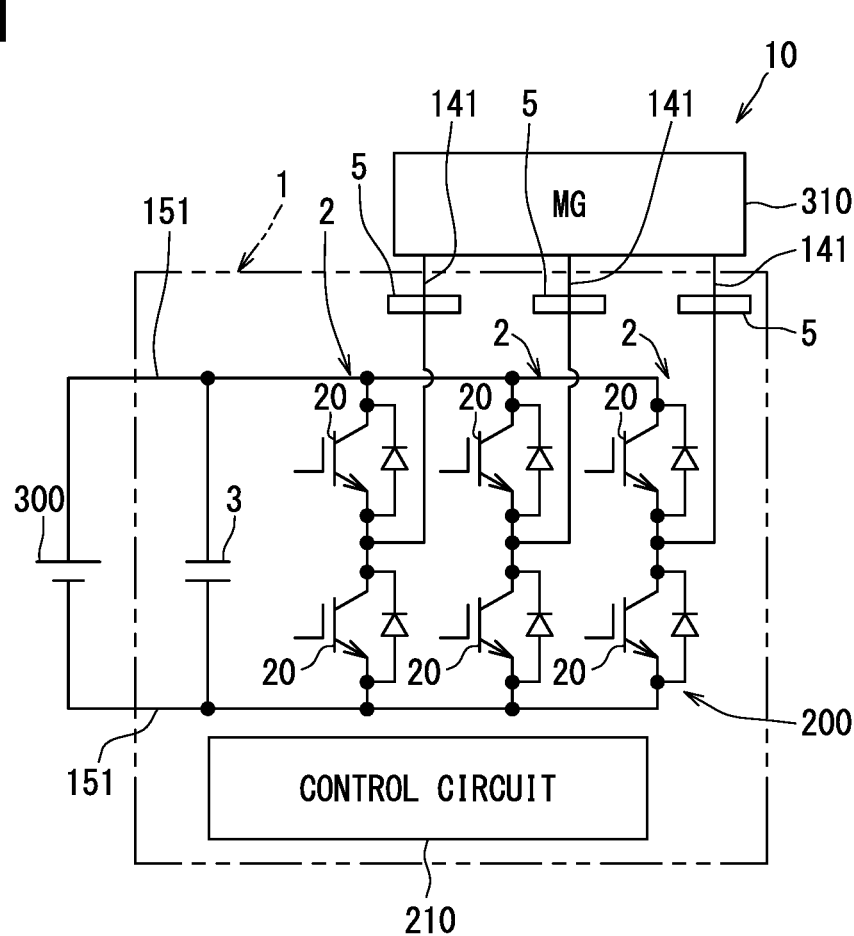
FIG. 1 is a circuit diagram of a power control apparatus according to a first embodiment.

Hereinafter, embodiments for implementing the present disclosure are described referring to drawings. In each embodiment, the same reference numerals may be given to parts corresponding to matters described in a preceding embodiment, and overlapping explanations may be omitted. When only a part of a configuration is described in an embodiment, the other preceding embodiments can be applied to the other parts of the configuration. It may be possible not only to combine parts the combination of which is explicitly described in an embodiment, but also to combine parts of respective embodiments the combination of which is not explicitly described if any obstacle does not especially occur in combining the parts of the respective embodiments.

JP2015-12743A describes a plurality of output busbars each connected to a plurality of output terminals of semiconductor modules. The plurality of output busbars each have a flat plate shape and are arranged in a thickness direction.

The output busbars of JP2015-12743A are provided so that a side surface forming a thickness of the flat plate shape faces a refrigerant discharge pipe. This output busbar has a small projected area with respect to the refrigerant discharge pipe. Therefore, the device of JP2015-12743A has room for improvement in terms of heat dissipation performance.

It an object disclosed in this specification to provide a power control apparatus capable of suppressing an amount of heat received from a semiconductor element and ensuring a heat dissipation performance of a busbar.

Disclosed aspects in this specification adopt different technical solutions from each other in order to achieve their respective objectives.

First Embodiment

A first embodiment disclosing an example of a drive system for a vehicle and a power control apparatus for a vehicle are described with reference to FIGS. 1 to 4. The power control apparatus may be applied to an in-vehicle power controller which is mounted on a vehicle such as an electric vehicle, a fuel battery vehicle or a hybrid vehicle. The vehicle include passenger cars, buses, construction work vehicles, agricultural machinery vehicles, and the like. The power control apparatus capable of achieving the object specified in the specification may be applied to, for example, an inverter device, a converter device, or the like. The converter device may be, for example, a power supply device with an AC (i.e., alternating current) input and a DC (i.e., direct current) output, a power supply device with a DC input and a DC output, or a power supply device with an AC input and an AC output. In the present embodiment, the power converter is applied to, for example, an inverter device and is described below.

As shown in FIG. 1, a vehicle drive system 10 is mounted on a vehicle and includes a DC power supply 300, a motor generator 310, and a power control apparatus 1.

The power control apparatus 1 includes at least an inverter circuit 200, a control circuit 210, and a smoothing capacitor 3. As shown in FIG. 1, the inverter circuit 200 includes semiconductor modules 2 and provides a power control unit. A smoothing capacitor 3 is connected in parallel to the semiconductor modules 2. The power control unit inverts the DC power supplied from the DC power supply 300 into the AC power by turning on and off the semiconductor elements 20 included in the semiconductor modules 2. The DC power supply 300 is, for example, secondary batteries. The secondary batteries may be a lithium ion secondary battery, a nickel hydrogen secondary battery, or an organic radical battery, for example.

The control circuit 210 comprises at least one processor circuit. One example of a processor circuit is a processor circuit that executes a program as a collection of a plurality of instructions. The processor circuit is a so-called microprocessor and is provided as a chip. The controller includes at least one non-transitory tangible storage medium for storing a program and data. The processor circuit provides functions of the device according to this disclosure by executing a program. Another example of a processor circuit is a processor circuit including a plurality of logic circuits or analog circuits. A plurality of logic circuits or analog circuits are configured to provide a plurality of substantive elements and their electrical connections so as to provide the functions of the apparatus according to this disclosure. A processor circuit may have various names such as an accelerator, a gate array, and an FPGA (Field-programmable gate array). The controller is also called a microcontroller or a microcomputer.

The motor generator 310 includes a three-phase AC rotary electric machine, i.e., a three-phase AC motor. The motor generator 310 functions as a vehicle driving power source, i.e., an electric motor. The motor generator 310 functions as a generator during regeneration. The power control apparatus 1 performs electric power conversion between the DC power supply 300 and the motor generator 310.

The power control apparatus 1 inverts a DC voltage into a three-phase AC voltage according to switching control by the control circuit 210, and outputs the three-phase AC voltage to the motor generator 310. As a result, the vehicle 100 travels by driving the motor generator 310 using the AC power inverted from the DC power by the power control unit. The power control apparatus 1 inverts the AC power generated by AC power generation of the motor generator 310 into the DC power, and outputs the DC power to a high-potential-side power line in the circuit. The power control apparatus 1 performs electric power conversion between the DC power supply 300 and the motor generator 310.

The motor generator 310 is coupled to an axle of the electric vehicle. Rotational energy of the motor generator 310 is transmitted to drive wheels of the electric vehicle via the axle. Rotational energy of the drive wheels is transmitted to the motor generator 310 via the axle. The motor generator 310 generate kinetic power by an AC power supplied from the power control apparatus 1. This applies a propulsive force to the drive wheels. The motor generator 310 regenerates by using the rotational energy transmitted from the drive wheels. The AC power generated by this regeneration is inverted into the DC power by the power control apparatus 1. This DC power is supplied to the DC power supply 300. This DC power is also supplied to various electrical loads mounted on the vehicle 100.

In the inverter circuit 200, the smoothing capacitor 3 is connected to the input of the power control unit, and the motor generator 310, which is an example of a load, is connected to the output. The smoothing capacitor 5 mainly smooths the DC voltage supplied from the DC power supply 300. The smoothing capacitor 3 is connected between the power line for the high potential side and the power line for the low potential side. The power line on the high potential side is connected to the positive electrode of the DC power supply 300. The power line on the low potential side is connected to the negative electrode of the DC power supply 300. The positive electrode of the smoothing capacitor 3 is connected to the power line on the high potential side between the DC power supply 300 and the semiconductor modules 2. The negative electrode of the smoothing capacitor 3 is connected to the power line on the low potential side between the DC power supply 300 and the semiconductor modules 2.

A P-busbar is provided on the power line on the high potential side. An N-busbar is provided on the power line on the low potential side. The P-busbar and the N-busbar are provided on the power lines on the input side with respect to the power control unit of the power control apparatus 1. Connecting terminals provided on the power line on the input side to the power control unit are provided at the ends of the P-busbar and the end of the N-busbar. An output terminal provided at an end of a power supply line, which supplies power from the DC power supply 300, is connected to this connection terminal.

The power control apparatus 1 includes three-phase legs connected in parallel between a P busbar connected to a positive electrode of the DC power supply 300 and an N busbar connected to a negative electrode of the DC power supply 300. Each one of phase legs includes semiconductor elements 20 connected in series between the P-busbar and the N-busbar. The inverter circuit 200 includes, as an example, three sets of the upper and lower arm circuit including two arms connected in series. The three upper and lower arm circuits correspond to, for example, a U-phase, a V-phase, and a W-phase, respectively, and are arranged in this order from the smoothing capacitor 3. A higher potential one of each of the upper and lower arm circuits may be referred to as an upper arm. A lower potential one of each of the upper and lower arm circuits may be referred to as a lower arm.

Each one of the arms has an IGBT as a switching element and a diode. The IGBT is an insulated gate bipolar transistor, which is a type of transistor. The IGBT and diode are provided on a semiconductor substrate. A semiconductor chip provided with an IGBT and a diode corresponds to the semiconductor element 20. In the upper arm, the collector is connected to the power line on the high potential side. In the lower arm, the emitter is connected to the power line on the low potential side. The emitter on the upper arm and the collector on the lower arm are connected to each other. The anode of the diode is connected to the emitter of the corresponding IGBT, and the cathode is connected to the collector of the corresponding IGBT.

The control circuit 210 generates a drive command for operating the IGBT and outputs the drive command to the drive circuit. The control circuit 210 generates the drive command based on a torque request input from a higher-level ECU and signals detected by various sensors. Examples of various sensors include a current sensor 5, a rotation angle sensor, and a voltage sensor. The control circuit 210 outputs a PWM signal as a drive command. The control circuit 210 has a microcomputer. The rotation angle sensor detects the rotation angle of the rotor of the motor generator 310 and outputs it to the control circuit 210. The voltage sensor detects the voltage across the smoothing capacitor 3 and outputs it to the control circuit 210.

The drive circuit is a driver which supplies a drive voltage to a gate of the IGBT of the corresponding arm based on the drive command of the control circuit 210. The drive circuit drives, i.e., turns on and turns off, the corresponding IGBT by applying a drive voltage. The power control apparatus 1 includes, for example, one drive circuit with respect to one arm for a phase.

The current sensor 5 detects an output current of the arm, i.e., detects a phase current flowing through the windings of each phase. The current sensor 5 outputs electric signals corresponding to the output currents of the arms to the control circuit 210. This electrical signals are feedback signals. The feedback signals are signals corresponding to an output current.

The power control apparatus 1 includes busbars including input busbars 151 and output busbars 141. The power control apparatus 1 includes busbars for both a power input and a power output. The busbars in the power control apparatus 1 include conductive members to be connected to input terminals and conductive members to be connected to output terminals. This busbar may be manufactured by shaping a conductive plate material into a shape by bending, cutting, or pressing. This busbar has a plate shape as a whole.

The busbar is a conductive member connected to an input side or an output side of at least one of the semiconductor modules 2 and the smoothing capacitor 3. Since such busbars each form one of electric power paths and generate heat, the busbars release heat to peripheral parts. The input busbars 151 are conductive members to which power is supplied from the DC power supply 300. The input busbars 151 are, for example, the P-busbar and the N-busbar.

The output busbars 141 are, for example, busbars provided on electric power paths through which an output current of the arms flow to the motor generator 310. The output busbars 141 include a plurality of terminal portions each connected to a plurality of power terminals 22 of the semiconductor modules 2.

The current sensor 5 detects an output current flowing through the output busbar 141. One of the output busbars 141 is provided on an electric power path that connects a connection portion between the upper arm and the lower arm to a winding of the motor generator 310 in the U-phase. One of the output busbars 141 is provided on an electric power path that connects a connection portion between the upper arm and the lower arm to a winding of the motor generator 310 in the V-phase. One of the output busbars 141 is provided on an electric power path that connects a connection portion between the upper arm and the lower arm to a winding of the motor generator 310 in the W-phase. The U-phase busbar, the V-phase busbar, and the W-phase busbar constitute the output busbars 141.

Figure 2:
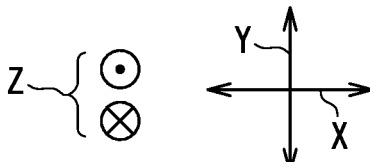
FIG. 2 is a plan view showing a schematic configuration of the power control apparatus.

As shown in FIG. 2, the power control apparatus 1 includes a busbar unit 14. The U-phase busbar, the V-phase busbar, and the W-phase busbar are integrally provided in the busbar unit 14. The plurality of busbars function as an output busbars 141 provided in the busbar unit 14.

The U-phase busbar, the V-phase busbar, and the W-phase busbar are provided on the power line on the output side with respect to the power control unit. Each end of the U-phase busbar, the V-phase busbar, and the W-phase busbar is provided with a connection terminal provided on the power lines on the output side with respect to the power control unit. Input terminal provided at ends of power supply lines that supplies power to the windings of each phase of the motor generator 310 are connected to those connection terminals.

The power control apparatus 1 is installed, for example, in a motor room in a vehicle where the motor generator 310 is installed. The motor room is a room formed between the front part of the vehicle and a partition wall provided at the front of the vehicle interior. This partition wall is one of the vehicle side members that partitions the motor room and the vehicle interior. Furthermore, the power control apparatus 1 may be installed in a space below a trunk of a vehicle, a space under a seat, or the like.

The power control apparatus 1 is fixed to an installation stand located in such a room or space. The installation stand is one of the vehicle side members such as a chassis of the vehicle, a part of the body, and other members mounted on the vehicle. The installation stand may be the motor generator 310. The power control apparatus 1 includes a case 11 which is fixed to an installation stand and accommodates a plurality of electrical components.

As shown in FIG. 2, the case 11 accommodates a smoothing capacitor 3, a power module unit 4, a current sensor 5, and a circuit board on which the control circuit 210 is mounted. The current sensor 5 is embedded in the busbar unit 14. That is, the current sensor 5 is provided integrally with the U-phase busbar, the V-phase busbar, and the W-phase busbar, which are the output busbars 141, in the busbar unit 14. The busbar unit 14 is fixed to a support base integrally provided in the case 11 using fixing devices such as bolts, screws, and rivets, and coupling methods such as welding, brazing.

Figure 3:
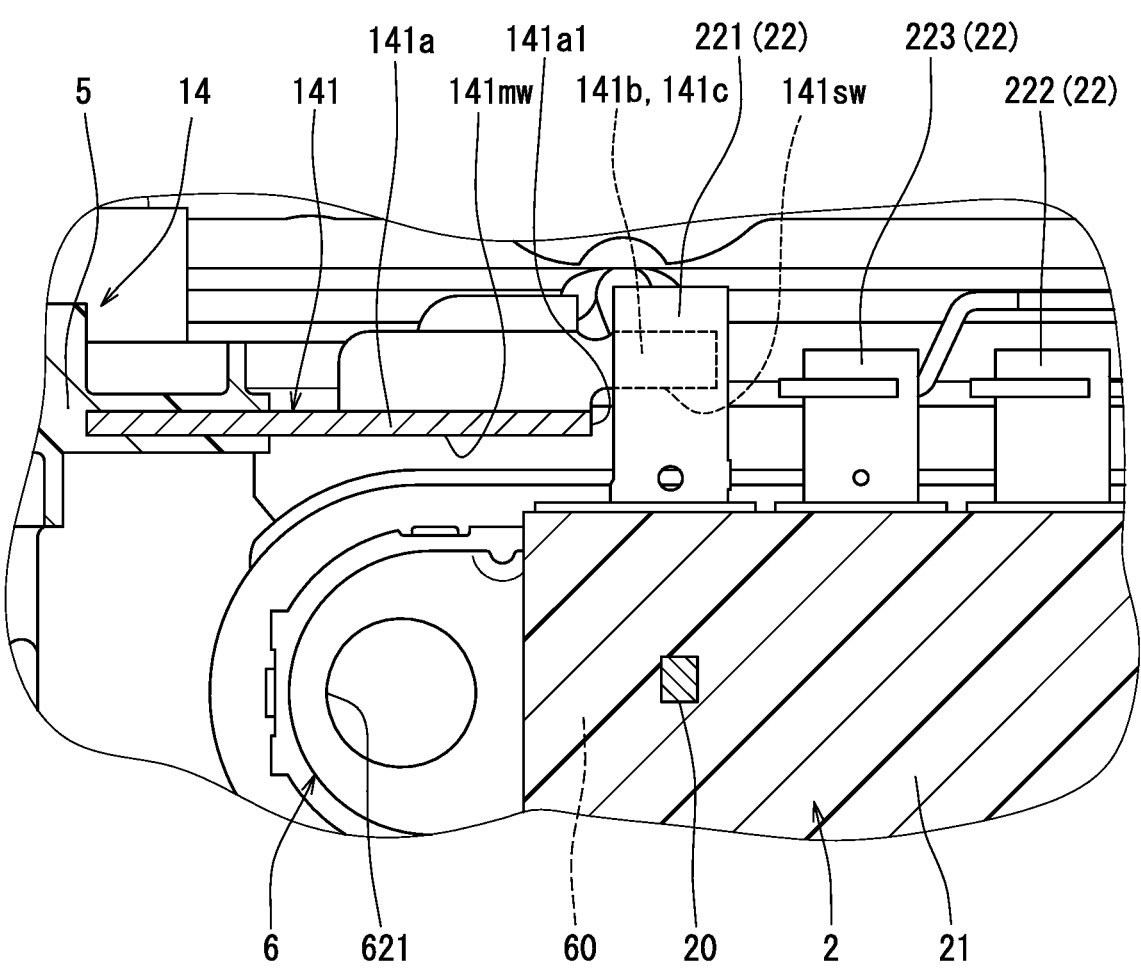
FIG. 3 is an enlarged view showing the configuration of a busbar.
Figure 3:
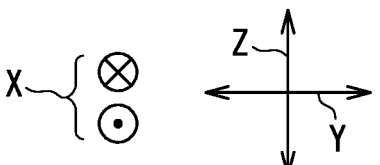

As shown in FIGS. 2 and 3, the busbar unit 14 includes a plurality of output busbars 141, a plurality of current sensor 5, and an insulating support member 142. The insulating support member 142 covers a predetermined portion of the output busbars 141 and the current sensors 5, and supports them integrally. The insulating support member 142 embeds the current sensors 5 by covering them. The insulating support member 142 insulates and supports a predetermined portion of the output busbars 141 by covering them. The insulating support member 142 insulates the plurality of output busbars 141 from each other and supports the plurality of busbars so as to maintain a distance between adjacent two of the output busbars 141.

The insulating support member 142 is formed mainly of resin having insulating properties, for example. The output busbars 141 and the current sensors 5 are provided in the busbar unit 14 by being insert molded integrally with the insulating support member 142 by placing them in a molding die forming the busbar unit 14, and then, by solidifying resin member surrounding them.

The busbar unit 14 includes a fixing portion which is integrally provided with the insulating support member 142. The fixing portion is made of the same material as the insulating support member 142. The fixing portion is fixed to the case 11 by a fastening force of a fastening member such as a bolt or a screw.

The semiconductor module 2 includes a main body 21 embedding the semiconductor element 20, and power terminals 22 and control terminals 23 each protruding from the main body 21. The semiconductor modules 2 are also called power modules. The power terminal 22 includes input terminals to which the DC voltage is applied and output terminals 221 connected to the output busbar 141. The input terminals are a positive terminal 222 and a negative terminal 223 that are electrically connected to the terminals of the smoothing capacitor 3. The input terminals are electrically connected to an output section of the DC power supply 300 via the input busbars 151. The output terminal 221 is configured to output one of the U phase, V phase, and W phase in a bridge circuit formed by a plurality of switching elements. The signal terminals 23 are connected to the control circuit 210 mounted on the control board. The control circuit 210 configures a circuit on which electronic components, such as an arithmetic element, which controls the operation of the semiconductor element 20 is mounted.

As shown in FIGS. 2 and 3, the output busbars 141 are members which include at least a first plate shaped portion 141a, a plurality of second plate shaped portions 141b, 141c, and 141d, and a plurality of bent portions. The first plate shaped portion 141a is located closer to the insulating support member 142 than the second plate shaped portion. The first plate shaped portion 141a is insulated and supported by covering a predetermined portion with an insulating support portion 142. The second plate shaped portion is located closer to the semiconductor module 2 than the first plate shaped portion 141a protruding from the insulating support member 142. The bent portion is a portion that connects each of the plurality of second plate portions and the first plate portion 141a. The first plate shaped portion 141a has a wider width surface 141mw extending along a plane parallel to the X-direction and the Y-direction, which are a stacking direction of the semiconductor modules 2. The first plate shaped portion 141a is adjacent to a communication pipe 621 and an end of a passage pipe member 60 in the cooling device 6 in a posture opposite to the internal passage of the cooling device 6 in the plate thickness direction.

The second plate shaped portion 141b extends perpendicular to the first plate shaped portion 141a via a bent portion at one end of the first plate shaped portion 141a in the X-direction. The second plate shaped portion 141b is placed in a posture in which the plate thickness direction intersects with the plate thickness direction of the first plate shaped portion 141a. The second plate shaped portion 141b has outer surfaces including a side surface 141sw having a narrower width corresponding to the plate thickness. The second plate shaped portion 141b is placed in a posture in which the side surface 141sw with the narrower width faces the semiconductor module 2. The second plate shaped portion 141b is placed in a posture in which the plate thickness direction is oriented in the X-direction. The side surface 141sw is a surface which is parallel to both the X-direction and the Y-direction and is defined with a side length in the X-direction, which is shorter, and a side length in the Y-direction, which is longer.

The second plate shaped portion 141d extends perpendicular to the first plate shaped portion 141a via a bent portion at the other end of the first plate shaped portion 141a in the X-direction. The second plate shaped portion 141d is placed in a posture in which the plate thickness direction intersects with the plate thickness direction of the first plate shaped portion 141a. The second plate shaped portion 141d has outer surfaces including a side surface 141sw having a narrower width corresponding to the plate thickness. The second plate shaped portion 141b is placed in a posture in which the side surface 141sw with the narrower width faces the semiconductor module 2. The second plate shaped portion 141d is placed in a posture in which the plate thickness direction is oriented in the X-direction.

The second plate shaped portion 141c extends perpendicular to the first plate shaped portion 141a via a bent portion between the second plate shaped portion 141b and the second plate shaped portion 141d. The second plate shaped portion 141c is placed in a posture in which the plate thickness direction intersects with the plate thickness direction of the first plate shaped portion 141a. The second plate shaped portion 141c has outer surfaces including a side surface 141sw having a narrower width corresponding to the plate thickness. The second plate shaped portion 141b is placed in a posture in which the side surface 141sw with the narrower width faces the semiconductor module 2. The second plate shaped portion 141c is placed in a posture in which the plate thickness direction is oriented in the X-direction.

As shown in FIG. 3, the first plate shaped portion 141a is placed such that the wider width surface 141mw faces the internal passage of the cooling device 6 in the plate thickness direction. The first plate shaped portion 141a is placed so that the wider width surface 141mw includes a portion that coincides with the internal passage of the cooling device 6 in both the X-direction and the Y-direction. The first plate shaped portion 141a is placed such that the wider width surface 141mw is located at a position not facing the semiconductor element 20. The first plate shaped portion 141a is placed such that the wider width surface 141mw is placed to be not aligned with the semiconductor element 20 at least in the Y-direction.

Figure 4:
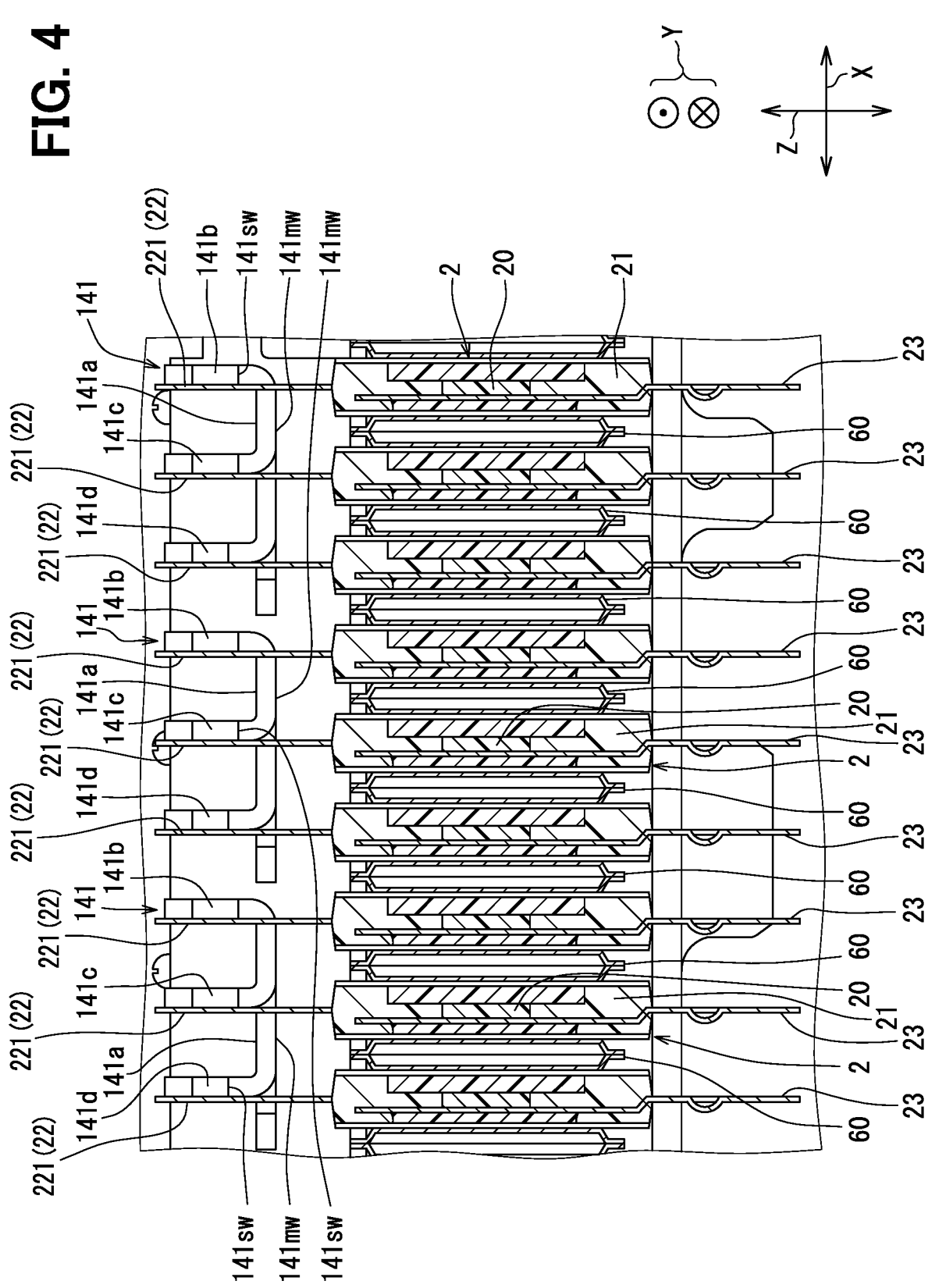
FIG. 4 is a cross-sectional view showing a structure related to busbars and semiconductor modules.

As shown in FIGS. 3 and 4, the second plate shaped portion is placed such that the side surface 141sw having a narrower width is located at a position facing the semiconductor element 20. The side surface 141sw having a narrower width is placed so as to have a portion that coincides with the semiconductor element 20 in both the X-direction and the Y-direction.

As shown in FIGS. 2 and 4, the busbar unit 14 includes a plurality of busbars arranged in the thickness direction of the semiconductor module 2. Each one of the output busbars 141 is individually connected to a predetermined semiconductor module 2 among the plurality of semiconductor modules 2.

The output busbars 141 include a plurality of branched terminal portions branched on a side of a distal end located on an opposite side of the insulating support member 142. Similar to the plurality of semiconductor modules 2, the plurality of terminal portions are arranged in the thickness direction of the semiconductor module 2 or the X-direction. The plurality of terminal portions are connected to the output terminals 221 of the semiconductor modules 2 in a one-to-one correspondence. This terminal portion corresponds to the second plate shaped portion. This terminal portion is placed so that the side surface 141sw having a narrower width is in a position facing the semiconductor module 2 or the semiconductor element 20.

As shown in FIG. 3, the first plate shaped portion 141a is placed so that the wider width surface 141mw is located closer to the cooling device 6 than the side surface 141sw of the second plate shaped portion 141b with respect to the distance in the height direction or the Z-direction. A Z-direction is a direction perpendicular to both the X-direction and the Y-direction. The second plate shaped portion is placed such that the side surface 141sw is located farther from the semiconductor element 20 than the wider width surface 141mw with respect to a distance in the height direction or the Z-direction. According to this configuration, it is possible to improve the heat dissipation from the wider width surface 141*mw*, to contribute suppressing heat reception at the side surface 141*sw*, and to cool the busbar effectively.

The smoothing capacitor 3 embeds a capacitor element which is sealed in a resin in a state where terminals to be connected to other electrical components are exposed. A sealing resin is made of a thermosetting resin such as an epoxy resin. A sealing resin is filled in a gap between capacitor element and terminals, and a housing portion for the capacitor. According to this configuration, the sealing resin seals the capacitor element and the terminals. A part of the terminals or the like protrudes from the sealing resin. The smoothing capacitor 3 is fixed to, for example, a wall of the case 11 by using fixing devices such as bolts, screws, and rivets, and coupling methods such as welding, brazing.

The power control apparatus 1 includes a cooling device 6 which cools the semiconductor modules 2. The cooling device 6 is fixed to, for example, a wall of the case 11 by using fixing devices such as bolts, screws, and rivets, and coupling methods such as welding, brazing. The power module unit 4 includes a plurality of semiconductor modules 2 and the cooling device 6 which are integrally formed. The cooling device 6 includes a plurality of passage pipe member 60 that are alternately stacked with the semiconductor modules 2, communication pipes 611, an inflow pipe 61, communication pipes 621, and an outflow pipe 62.

The pressurizing member 7 presses the power module unit 4 in the X-direction, which is the stacking direction. Thereby, the power module unit 4 is fixed in the case 11 while ensuring a contact pressure between the semiconductor module 2 and the passage pipe member 60. An example of the pressurizing member 7 is a leaf spring.

The inlet pipe 61 is a fluid introduction portion of the cooling device 6. The outflow pipe 62 is a fluid discharge portion of the cooling device 6. The communication pipes 611 connect the plurality of passage pipe members 60 on a downstream side of the inflow pipe 61. The communication pipes 611 form a passage extending in the stacking direction of the semiconductor modules 2 at one end side of the cooling device 6. The communication pipes 621 connect the plurality of passage pipe members 60 on an upstream side of the outflow pipe 62. The communication pipe 621 forms a passage extending in the stacking direction of the semiconductor modules 2 at the other end side of the cooling device 6.

The cooling fluid flows into the inflow pipe 61 from an external introduction pipe, is divided into the plurality of passage pipe members 60, joins at the outflow pipe 62, and then flows out from the cooling device 6 into an external discharge pipe. Each one of the passage pipe members 60 is in contact with an adjacent one of the semiconductor modules 2. The cooling fluid flowing through each passage pipe member 60 absorbs heat from the adjacent semiconductor module 2 and cools it. An internal passage of each passage pipe member 60 communicates with an internal passage of the inflow pipe 61 on an upstream side and communicates with an internal passage of the outflow pipe 62 on a downstream side. The cooling fluid flowing inside the cooling device 6 is preferably an antifreeze liquid having a large heat capacity, such as LLC (available as Long-Life Coolant). A gas such as an air may be employed as the cooling fluid. The cooling device 6 performs a function of absorbing heat not only from the semiconductor module 2 but also from each part adjacent to the internal passage of the cooling device 6 to cool them.

The external introduction pipe is an external pipe connected to the inflow pipe 61 outside the case 11. The external discharge pipe is an external pipe connected to the outflow pipe 62 outside the case 11. The inflow pipe 61 and the outflow pipe 62 are flow path connection members to which external pipe are connected outside the case 11. The external introduction pipe and the external discharge pipe may be configured of a hard pipe that does not easily deform or a flexible hose that can be easily deformed.

Functions and advantages produced by the power control apparatus 1 according to the first embodiment are described. The power control apparatus 1 includes a semiconductor module 2 which embeds a semiconductor element 20, a cooling device 6 which cools the semiconductor module, and a busbar unit 14. The busbar unit 14 supports busbars connected to the semiconductor modules 2 and includes electrical components. The busbar includes the first plate shaped portion 141*a* and the second plate shaped portion 141*b*, 141*c*, and 141*d*. The second plate shaped portion 141*b*, 141*c*, and 141*d* is placed in a posture in which the plate thickness direction thereof intersects with a plate thickness direction of the first plate shaped portion 141*a*. The first plate shaped portion 141*a* is adjacent to the cooling device 6 in a posture facing the inner passage of the cooling device 6 in the plate thickness direction. The second plate shaped portion is placed in a posture in which the side surface 141*sw* having a narrower width corresponding to the plate thickness among outer surfaces faces the semiconductor module 2.

According to this configuration, the first plate shaped portion 141*a* of the busbar faces the internal passage in the place thickness direction, so that the wider width surface 141*mw* of the first plate shaped portion 141*a* is adjacent to the cooling device 6. Thereby, the wider width surface 141*mw* of the first plate shaped portion 141*a* having a large surface area can be cooled by the cooling device 6. Therefore, the cooling device 6 can be used to efficiently absorb heat from the busbar.

Further, the second plate shaped portion is provided such that the side surface 141*sw* having a narrower width corresponding to the plate thickness among the outer surfaces faces the semiconductor module 2. Therefore, the side surface 141*sw* of the second plate shaped portion, which has a smaller surface area than the wider width surface 141*mw* of the first plate shaped portion 141*a*, faces the semiconductor module 2, which is a heat generating element. With this positional relationship, it is possible to suppress the amount of heat received by the busbar by receiving the heat from the semiconductor module 2 via the side surface 141*sw* having a narrower width on the second plate shaped portion. According to the power control apparatus 1, it is possible to suppress the amount of heat received from the semiconductor element 20 and ensure the heat dissipation performance of the busbar.

Further, in the power control apparatus 1, since the first plate shaped portion 141*a* faces the internal passage of the cooling device 6 in the plate thickness direction, the first plate shaped portion 141*a* is easily deflected in the plate thickness direction against vibrations. Thereby, it is possible to provide the busbar unit 14 that can reduce vibration stress due to vibration in the plate thickness direction.

The first plate shaped portion 141*a* is placed such that the wider width surface 141*mw* facing the internal passage of the cooling device 6 in the plate thickness direction is located at a position not facing the semiconductor element 20. According to this configuration, the wider width surface 141*mw* of the first plate shaped portion 141*a* of the busbar does not face the semiconductor element 20 that generates a large amount of heat, but faces the internal passage of the cooling device 6. Thereby, it is possible to suppress the amount of heat received by the busbar, and to cool the wider width surface 141$mw$ by the cooling device 6, so that the heat dissipation of the busbar can be efficiently improved.

The second plate shaped portion is placed such that the side surface 141$sw$ is in a position facing the semiconductor element 20. According to this configuration, the side surface 141$sw$ of the second plate shaped portion having a smaller surface area than the wider width surface 141$mw$ faces the semiconductor element 20 that generates a large amount of heat. With this positional relationship, it is possible to suppress the amount of heat received by the busbar by receiving the heat from the semiconductor element 20 via the side surface 141$sw$ having a narrower width on the second plate shaped portion.

The busbar unit 14 includes the insulating support member 142 which is made of an insulating material and supports the first plate shape portions 141$a$. The second plate shaped portion is located closer to the semiconductor module 2 than the first plate shaped portion 141$a$ protruding from the insulating support member 142. According to this configuration, the first plate shaped portion 141$a$ is located close to the insulating support member 142 and is provided at a position separated from the semiconductor module 2. Thereby, the amount of heat received from the semiconductor module 2 can be suppressed, and the heat dissipation performance of the busbar can be efficiently improved.

The power control apparatus 1 includes a plurality of semiconductor modules 2 arranged in a stacked manner in the thickness direction. Thereby, the allowable power of the semiconductor module 2 can be improved. The busbar unit 14$v$ includes a plurality of busbars each individually connected to a predetermined semiconductor module 2 among the plurality of semiconductor modules 2. The plurality of busbars are arranged in the thickness direction of the semiconductor module. According to this, the plurality of busbars arranged in the thickness direction of the semiconductor module 2 can: (1) cool the wider width surface 141$mw$ of the first plate shaped portion 141$a$ by the cooling device 6; and (2) receive heat from the semiconductor module 2 via the side surface 141$sw$ having a narrower width of the second plate shaped portion.

The second plate shaped portion has a plurality of terminal portions each branched and connected to an output terminal 221 of the semiconductor module 2. The second plate shaped portion is placed in a posture in which the side surface 141$sw$ having a narrower width corresponding to the plate thickness among outer surfaces faces the semiconductor module 2. According to this configuration, each terminal portion is placed so that the side surface 141$sw$ having a narrower width faces the semiconductor module 2. Thereby, it is possible to suppress the amount of heat received by the busbar by receiving the heat from the semiconductor module 2 via the side surface 141$sw$ having a narrower width on the plurality of the terminal portions. Further, even if vibrations are transmitted to the second plate shaped portion, the vibrations are distributed and propagated through the plurality of terminal portions, which contributes to suppressing vibrations at a connection portion with the semiconductor module 2.

The plurality of terminal portions are each individually connected to a predetermined semiconductor module 2 among the plurality of semiconductor modules 2 arranged in a stacked manner in the thickness direction. The plurality of terminal portions are arranged in the thickness direction of the semiconductor module 2. According to this configuration, all the terminal portions included in the busbar unit 14 are individually connected to the semiconductor modules 2 arranged in order in the thickness direction in a one-to-one correspondence. Thereby, all the terminal portions can receive heat from the semiconductor module 2 through the side surface 141$sw$ having a narrower width. Therefore, the busbar unit 14 can suppress the amount of heat received from the semiconductor module 2.

The electrical component included in the busbar unit 14 is a current sensor 5 which is integrally covered with the busbar by an insulating support member 142 and detects a current flowing through the busbar. According to this configuration, it is possible to provide the busbar unit 14 which is capable of reducing the amount of heat received by the busbar involved in current detection by the current sensor 5, improving heat dissipation, and reducing vibration stress.

Other Embodiments

The disclosure of this specification is not limited to the illustrated embodiment. The disclosure encompasses the illustrated embodiments and variations based on the embodiments by those skilled in the art. For example, the disclosure is not limited to the combinations of components and elements shown in the embodiments, and various modifications and implementations can be performed. The disclosure may be implemented in various combinations. The disclosure may have additional portions that may be added to the embodiments. The disclosure includes the embodiments from which the parts and the components are omitted. The disclosure encompasses the replacement or combination of components, elements between one embodiment and another. The disclosed technical scope is not limited to the description of the embodiments. It should be understood that some disclosed technical ranges are indicated by description of claims, and includes every modification within the equivalent meaning and the scope of description of claims.

The busbar unit 14 in the embodiment described above may include input busbars 151 instead of the output busbars 141. In this configuration, the electrical components included in the busbar unit 14 may be replaced with components having terminal portions of power connection lines, capacitors, and the like.

The power control apparatus capable of achieving the object disclosed in the specification may have a configuration that does not include the control circuit 210. For example, a higher-level ECU or the like may have the same function as the control circuit 210. Further, in the embodiment described above, an example was shown in which a drive circuit is provided for each arm, but the configuration is not limited to this. For example, one drive circuit may be provided for one upper and lower arm.

The power control apparatus capable of achieving the object disclosed in the specification may further include a converter as a power conversion circuit. The converter is disposed between the DC power supply 300 and the smoothing capacitor 3. The converter may be configured with a reactor and upper and lower arm circuits. The power control apparatus may further include a filter capacitor for removing power supply noise from the DC power supply 300. For example, the filter capacitor is provided between the DC power supply 300 and the converter.

What is claimed is:

1. A power control apparatus, comprising:
   a semiconductor module embedding a semiconductor element;

a cooling device which cools the semiconductor module by enabling a cooling fluid to flow through an internal passage; and a busbar unit which supports a busbar connected to the semiconductor module and includes an electrical component, wherein the busbar includes a first plate shaped portion and a second plate shaped portion placed in a posture such that a plate thickness direction thereof intersects with a plate thickness direction of the first plate shaped portion, and wherein the first plate shaped portion is placed to be adjacent to the cooling device in a posture facing an inner passage of the cooling device in the plate thickness direction, and wherein the second plate shaped portion has outer surfaces including a side surface having a narrower width corresponding to a plate thickness, and wherein the second plate shaped portion is placed in a posture in which the side surface faces the semiconductor module.

2. The power control apparatus according to claim 1, wherein the first plate shaped portion is placed such that a wider width surface facing the internal passage of the cooling device in the plate thickness direction is located at a position not facing the semiconductor element.

3. The power control apparatus according to claim 1, wherein the second plate shaped portion is placed such that the side surface is located at a position facing the semiconductor element.

4. The power control apparatus according to claim 1, wherein the busbar unit includes an insulating support member which is formed of an insulating material and supports the first plate shaped portion, and wherein the second plate shaped portion is located closer to the semiconductor module than the first plate shaped portion protruding from the insulating support member.

5. The power control apparatus according to claim 1, wherein the semiconductor module is one of a plurality of semiconductor modules arranged in a stacked manner in a thickness direction, and wherein the busbar unit includes a plurality of busbars each individually connected to a predetermined semiconductor module among the plurality of semiconductor modules and arranged in the thickness direction of the semiconductor module.

6. The power control apparatus according to claim 4, wherein the second plate shaped portion has a plurality of terminal portions each branched and connected to an output terminal of the semiconductor module, and wherein the terminal portions are placed in a posture in which a side surface with a narrower width corresponding to the plate thickness faces the semiconductor module.

7. The power control apparatus according to claim 6, wherein the semiconductor module is one of a plurality of semiconductor modules arranged in a stacked manner in a thickness direction, and wherein the plurality of terminal portions are individually connected to a predetermined semiconductor module among the plurality of semiconductor modules in a one-to-one correspondence, and are arranged in the thickness direction of the semiconductor module.

8. The power control apparatus according to claim 4, wherein the electrical component is a current sensor which is integrally covered with the busbar by the insulating support member and detects a current flowing through the busbar.

* * * * *